United States Patent
Binnard

(10) Patent No.: US 6,758,313 B2
(45) Date of Patent: Jul. 6, 2004

(54) METHOD AND APPARATUS FOR OPERATING A VIBRATION ISOLATION SYSTEM HAVING ELECTRONIC AND PNEUMATIC CONTROL SYSTEMS

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/283,155

(22) Filed: Oct. 30, 2002

(65) Prior Publication Data

US 2003/0057619 A1 Mar. 27, 2003

Related U.S. Application Data

(62) Division of application No. 09/662,840, filed on Sep. 15, 2000, now Pat. No. 6,523,695.

(51) Int. Cl.[7] .............................................. F16M 13/00
(52) U.S. Cl. ......................... 188/378; 248/550; 268/136
(58) Field of Search .................................. 188/378, 379, 188/380; 268/64.11, 146.14, 146.15, 64.28, 136; 248/550, 638, 562, 563, 636; 73/664

(56) References Cited

U.S. PATENT DOCUMENTS

| | | | | |
|---|---|---|---|---|
| 4,181,026 A | * | 1/1980 | Abstein, Jr. et al. | ........... 73/665 |
| 4,821,205 A | | 4/1989 | Schutten et al. | |
| 5,285,995 A | | 2/1994 | Gonzalez et al. | |
| 5,478,043 A | | 12/1995 | Wakui | |
| 5,564,537 A | | 10/1996 | Shoureshi | |
| 5,876,012 A | | 3/1999 | Haga et al. | |
| 6,036,162 A | | 3/2000 | Hayashi | |
| 6,170,622 B1 | * | 1/2001 | Wakui et al. | ............... 188/378 |
| 6,213,443 B1 | * | 4/2001 | Wakui | ....................... 248/550 |
| 6,286,644 B1 | | 9/2001 | Wakui | |
| 6,322,060 B1 | | 11/2001 | Mayama et al. | |
| 6,327,024 B1 | | 12/2001 | Hayashi et al. | |

FOREIGN PATENT DOCUMENTS

WO    WO 99/22272    5/1999

* cited by examiner

*Primary Examiner*—Matthew C. Graham
(74) *Attorney, Agent, or Firm*—Finnegan, Henderson, Farabow, Garrett & Dunner, LLP

(57) ABSTRACT

A method and apparatus for implementing an active vibration isolation system (AVIS) is provided. The AVIS includes a pneumatic control system and an electronic control system. The pneumatic control system supports a mass sensitive to vibration and isolates the mass from high frequency external disturbances. The electronic control system isolates the mass from low frequency external disturbances. The pneumatic control system includes a compliance chamber filled with a fluid to pneumatically support the mass, pressure sensor to measure the pressure level in the compliance chamber, and pneumatic actuator to control the pressure level to minimize the effects of pressure variation in the compliance chamber. The electronic control system includes at least one motion sensor to measure the actual position of the mass as the mass moves due to vibration, at least one feedback system to generate a corresponding signal, an electronic controller to generate signal(s) representing the calculated electronic force needed to compensate for the vibration, and an electronic actuator to generate the electric force to isolate the mass from the external disturbances. The pneumatic and electronic control systems work together to provide high frequency response and eliminate heat dissipation from the electronic control system.

32 Claims, 10 Drawing Sheets

METHOD AND APPARATUS FOR OPERATING A VIBRATION ISOLATION SYSTEM HAVING ELECTRONIC AND PNEUMATIC CONTROL SYSTEMS

This application is a division of Ser. No. 09/662,840 filed Sep. 15, 2000 now U.S. Pat. No. 6,523,695.

BACKGROUND OF THE INVENTION

This invention relates to a vibration isolation apparatus and methods. Particularly, this invention relates to methods and apparatus for an active vibration isolation system (AVIS) that use a combination of pneumatic control system and electronic control system to support a mass and isolate the mass from external disturbances, such as vibration. The AVIS may be used in a photolithography process.

2. Description of the Related Art

Photolithography is used for manufacturing integrated circuits. Light is transmitted through non-opaque portions of a pattern on a reticle, or photomask, through a projection exposure apparatus, and onto a wafer of specially-coated silicon or other semiconductor material. The uncovered portions of the coating that are exposed to light harden. The unhardened coating is then removed by an acid bath. Thus, the layer of uncovered silicon is altered to produce one layer of the integrated circuit. Conventional systems use visible and ultraviolet light for this process. Recently, however, visible and ultraviolet light have been replaced with electron, X-ray, and laser beams, which permit smaller feature sizes in the patterns.

As the miniaturization of a circuit pattern progresses, the focus depth of the projection exposure apparatus becomes very small. As a result, a primary consideration for an overall design of the photolithography system includes building components of the system that achieve precision by maintaining small tolerances. Any vibration, distortion, or misalignment caused by external or environmental disturbances must be kept at minimum. These external disturbances affecting an individual part collectively alter the focusing properties of the photolithography system.

Environmental effects may come from, among other things, heat generated by an electric motor that drives the wafer carrying stage device. The heat generated from the motor spreads to the surrounding environment changing index of refraction of the surrounding gas. In addition, heat also affects the neighboring components causing the components of the photolithography system to expand according to their coefficients of thermal expansion.

Environmental effects may also come from vibrations from moving parts, the ground, or other aspects. Therefore, in a sensitive system where alignment accuracy is essential, such as a lithography system to manufacture semiconductor wafers, there is a need for an isolation system to substantially reduce vibration.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a method for operating a vibration isolation system having a pneumatic control system and an electronic control system. The method comprises the step of generating a pneumatic force in the pneumatic control system to support a mass. The pneumatic force is produced by a pressure level in a compliance chamber. The pressure level is being controlled in response to a pressure error signal. The method also comprises the steps of delivering the pressure error signal to the electric control system, and monitoring a motion error signal of the mass in the electronic control system. The motion error signal is being used to generate an electronic force to isolate the mass from vibration. The electronic force is being determined based on a combination of the pressure error signal and the motion error signal.

A second aspect of the present invention is a method for operating a vibration isolation system having a pneumatic control system and an electronic control system. The method comprises the step of monitoring a motion error signal of a mass in the electronic control system. The motion error signal is being used to generate an electronic error signal. The method also comprises the steps of delivering the electronic error signal to the pneumatic control system, and generating a pneumatic force in the pneumatic control system to support the mass. The pneumatic force is being determined based on a combination of the electronic error signal and a pressure level in a compliance chamber. The pressure level is being controlled in response to a pressure error signal. The method further comprises the steps of delivering the pressure error signal to the electric control system, and generating an electronic force in the electronic control system to isolate the mass from vibration. The electronic force is being determined based on the pressure error signal.

A third aspect of the present invention is a method for operating a vibration isolation system having a pneumatic control system and an electronic control system. the method comprises the steps of generating a pressure error signal in the pneumatic control system based on a pressure signal of a compliance chamber and a reference pressure signal, and controlling the pressure level in the compliance chamber in response to the pressure error signal, the compliance chamber generating a pneumatic force in proportion to the controlled pressure level to pneumatically support a mass. The method also comprises the steps of delivering the pressure error signal to the electronic control system, comparing a motion signal of the mass in the electronic control system with a reference motion signal to generate a motion error signal, and combining the motion error signal and the pressure error signal. The method further comprises the step of determining an electronic force to isolate the mass from vibration based on the combined motion and pressure error signals.

A fourth aspect of the present invention is a method for operating a vibration isolation system having a pneumatic control system and an electronic control system. The method comprises the steps of comparing an actual motion signal of a mass in the electronic control system with a reference motion signal to generate a motion error signal, determining an electronic error signal based on the motion error signal, and delivering the electronic error signal to the pneumatic control system. The method also comprises the steps of comparing a pressure signal of a compliance chamber in the pneumatic control system with a reference pressure signal and combining the electronic error signal thereto to generate a pressure error signal, and controlling the pressure level in the compliance chamber in response to the pressure error signal. The compliance chamber generates a pneumatic force proportionate to the controlled pressure level to pneumatically support the mass. The method further comprises the steps of delivering the pressure error signal to the electronic control system, and determining an electronic force in the electronic control system based on the pressure error signal to isolate the mass from vibration.

A fifth aspect of the present invention is a vibration isolation system, comprising a pneumatic control system having a compliance chamber to generate a pneumatic force that supports a mass based on a pressure error signal, and an electronic control system having a motion sensor to generate a motion error signal of the mass. The vibration isolation system, also comprises a force generator connected with the pneumatic control system and the electronic control system. The force generator generates an electronic force based on the results of a combination of the pressure error signal and the motion error signal to isolate the mass from vibration.

A sixth aspect of the present invention is a vibration isolation system having a pneumatic control system and an electronic control system. The vibration isolation system comprises a motion sensor, a compliance chamber, a pressure sensor, a pneumatic force generator, and an electronic force generator. The motion sensor generates a motion error signal of a mass in the electronic control system. The motion error signal is: being used to generate an electronic error signal. The compliance chamber and the pressure sensor are provided in the pneumatic control system. The pressure sensor controls a pressure level in the compliance chamber to generate a pressure error signal. The pneumatic force generator is connected to the compliance chamber and electronic control system. The pneumatic force generator generates a pneumatic force that supports the mass based on the results of a combination of the electronic error signal and the pressure level in the compliance chamber. The electronic force generator is connected to the pneumatic control system. The electronic force generator generates an electronic force that isolates the mass from vibration based on the pressure error signal.

A seventh aspect of the present invention is a vibration isolation system having a pneumatic control system and an electronic control system. The vibration isolation system comprises a pressure sensor and a first controller. The pressure sensor generates a pressure error signal based on a pressure information of a compliance chamber and a reference pressure information. The first controller is connected to the pressure sensor for controlling a pressure level in the compliance chamber in response to the pressure error signal. The vibration isolation system also comprises a pneumatic force generator, a second controller, and an electronic force generator. The pneumatic force generator is connected to the first controller for generating a pneumatic force determined based on a controlled pressure level to pneumatically support a mass. The second controller is connected to the first controller for comparing a motion information of the mass with a reference motion signal to generate a motion error signal, and for generating an electronic force signal based on the motion error signal and the pressure error signal. The electronic force generator is connected to the second controller for generating an electronic force to isolate the mass from vibration based on the motion error signal and the pressure error signal.

An eighth aspect of the present invention is a vibration isolation system having a pneumatic control system and an electronic control system, comprising four controllers. The first controller compares an actual motion signal of a mass in the electronic control system with a reference motion signal to generate a motion error signal and to determine an electronic error signal based on the motion error signal. The second controller compares a pressure signal of a compliance chamber in the pneumatic control system with a reference pressure signal, and to combine the electronic error signal thereto to generate a pressure error signal. The third controller controls the pressure level in the compliance chamber in response to the pressure error signal. The compliance chamber generates a pneumatic force proportionate to the controlled pressure level to pneumatically support the mass. The fourth controller determines an electronic force in the electronic control system based on the pressure error signal to isolate the mass from vibration.

A further aspect of the present invention is a vibration isolation system using the methods as summarized in the above aspects of the invention. Yet, a further aspect of the present invention is a lithography system comprising the vibration isolation system and an object on which an image has been formed by the lithography system.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to several embodiments of methods and apparatus consistent with the invention, examples of which are illustrated in the accompanying drawings. The invention will be further clarified by the following examples, which are intended to be exemplary of the invention.

A vibration isolation system consistent with the principles of the present invention is also referred to as an active vibration isolation system (AVIS). The system may be an individual part, a group of parts, or even the system as a whole. For example, in a lithography system, the system may be a stage device, a projection exposure apparatus, or any system thereof. This invention, however, is not limited to any particular application. Rather, the method and system disclosed herein could be used in any system requiring vibration isolation.

Figure 1:
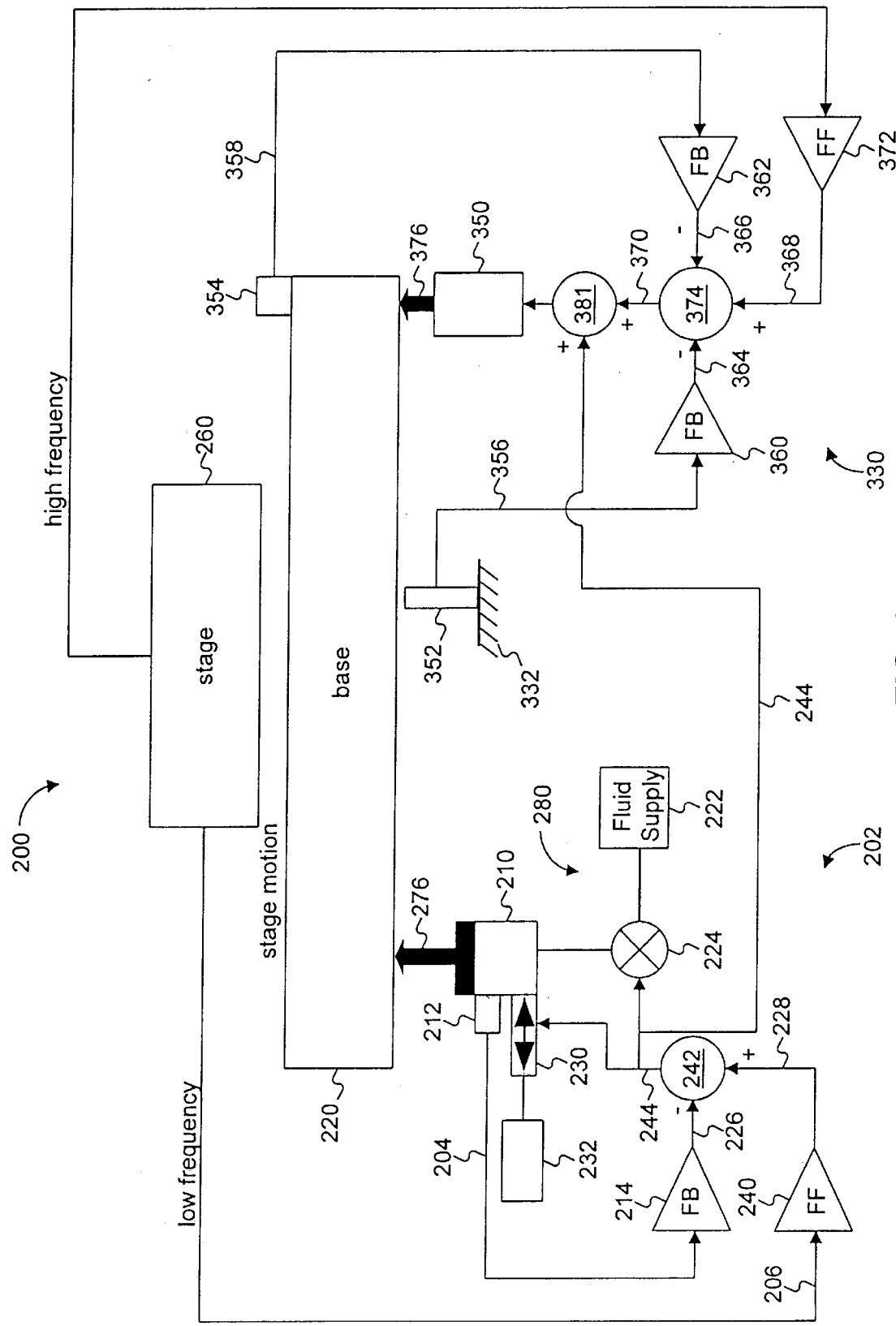
FIG. 1 is a schematic view of a first embodiment of an active vibration isolation system (AVIS) consistent with the principles of the present invention.

An AVIS 200, illustrated in FIG. 1, includes a pneumatic control system 202 and an electric control system 330. Pneumatic control system 202 supports a mass 220 and isolates mass 220 from high frequency disturbances, while electronic control system 330 isolates the mass from low frequency disturbances. The electronic control system 330 functions as the "master" controller, while the pneumatic control system 202 as the "slave" controller. In this example, mass 220 is a granite base over which a wafer stage device 260 moves.

Figure 8:
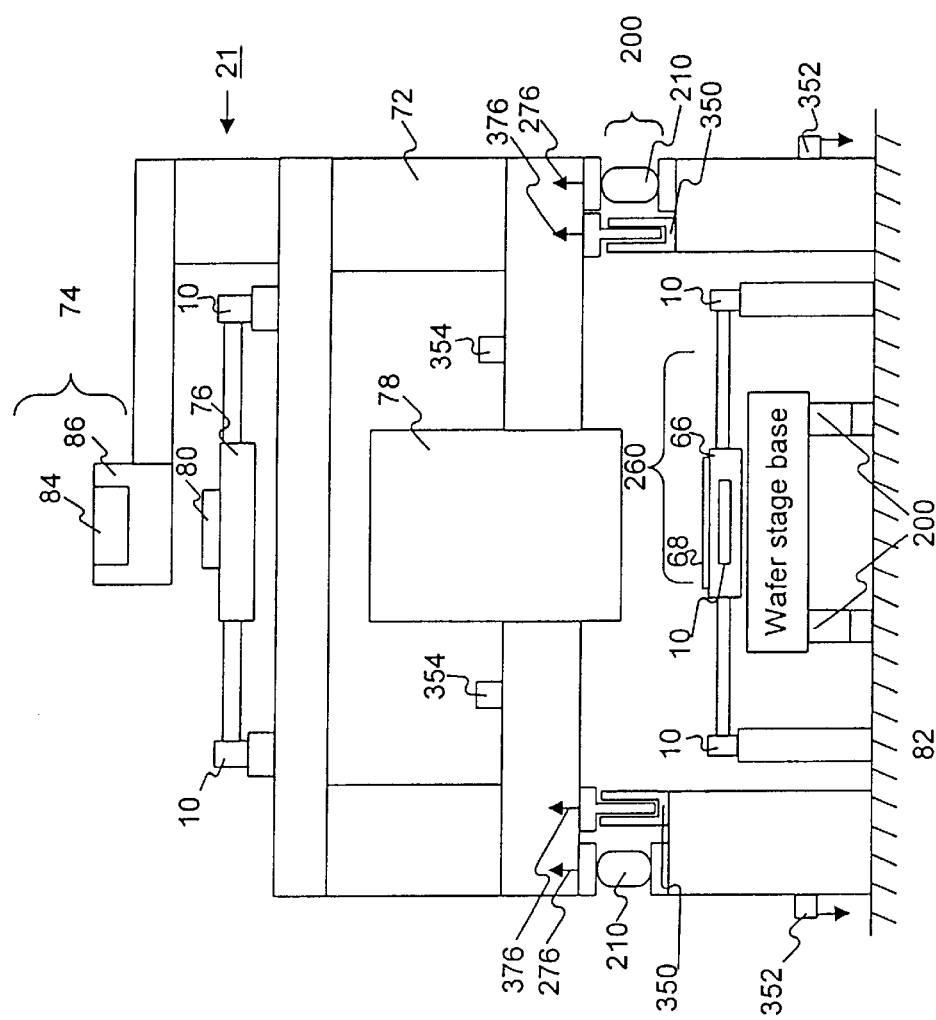
FIG. 8 is an elevation view of an exposure apparatus utilizing an AVIS having features of the present invention.

The pneumatic control system 202 includes a compliance chamber 210 filled with a fluid to pneumatically support mass 220. Compliance chamber 210 is also shown in FIG. 8 when the AVIS is used to isolate vibration in exposure apparatus 21. The pressure level signal 204 of compliance chamber 210 is proportionate to a pneumatic force 276 supporting mass 220. Pneumatic control system 202 also includes a pressure sensor 212 for measuring the pressure level in the compliance chamber. Pneumatic control system 202 further includes a pneumatic feedback system 214 and a pneumatic actuator 280 (shown in FIGS. 3 and 6) for controlling the pressure level in compliance chamber 210 to maintain a constant pressure level therein. FIG. 1 illustrates pneumatic actuator 280 as a combination of a fluid supply 222 connected to a supply regulator 224, and a bellows 230 connected to an actuator 232. The supply regulator 224 and actuator 232 control the pressure level in compliance chamber 210 by controlling the fluid flow between compliance chamber 210 and fluid supply 222 and bellows 230, respectively.

Pneumatic control device 202 also includes a pneumatic feedforward system 240, such as a computer, which determines a reference pressure signal 228 of compliance chamber 210 based on low frequency signal 206. Low frequency signal 206 is based on the weight of mass 220 and the position of a center of gravity of mass 220. Reference pressure signal 228 represents the pressure level necessary to maintain the constant position of mass 220. Pneumatic control device 202 also includes a summing junction 242 to calculate a difference between reference pressure signal 228 and measured pressure signal 226 and to generate a pressure error signal 244. In response to pressure error signal 244, pneumatic actuator 280 controls the pressure level in compliance chamber 210 so that pressure level signal 204 is substantially equal to reference signal 228.

Electronic control system 330 includes a position sensor 352, a position feedback system 360, and an electronic actuator 350. Position sensor 352 and electronic actuator 350 are also shown in FIG. 8 when the AVIS is used to isolate vibration in exposure apparatus 21. Position sensor 352 detects a position 356 of mass 220 with respect to a reference point, for example, the ground 82, as mass 220 vibrates or moves due to external disturbances. Position feedback system 360, upon receiving the actual position 356, generates a position signal 364.

In addition, electronic control system 330 may also include a velocity sensor 354 (see also FIG. 8) and velocity feedback system 362. Velocity sensor 354 measures an actual velocity 358 of mass 220 caused by the external disturbances. Velocity feedback system 362, upon receiving the actual velocity 358, generates a velocity signal 366.

Further, electronic control system 330 includes an electronic feedforward system 372, which uses a computerized mathematical model of the AVIS 200 to generate a disturbance canceling force signal 368 representing a force to be exerted on mass 220 to compensate for known disturbances.

Position signal 364, velocity signal 366, and disturbance canceling force signal 368 enter a summing junction 374, which calculates an electronic error signal 370 and delivers it to electronic actuator 350. Electronic actuator 350 then exerts an electronic force 376 corresponding to electronic error signal 370 onto mass 220 to compensate for a positional drift of mass 220 with respect to reference point 82 and for vibration caused by disturbances.

Figure 2:
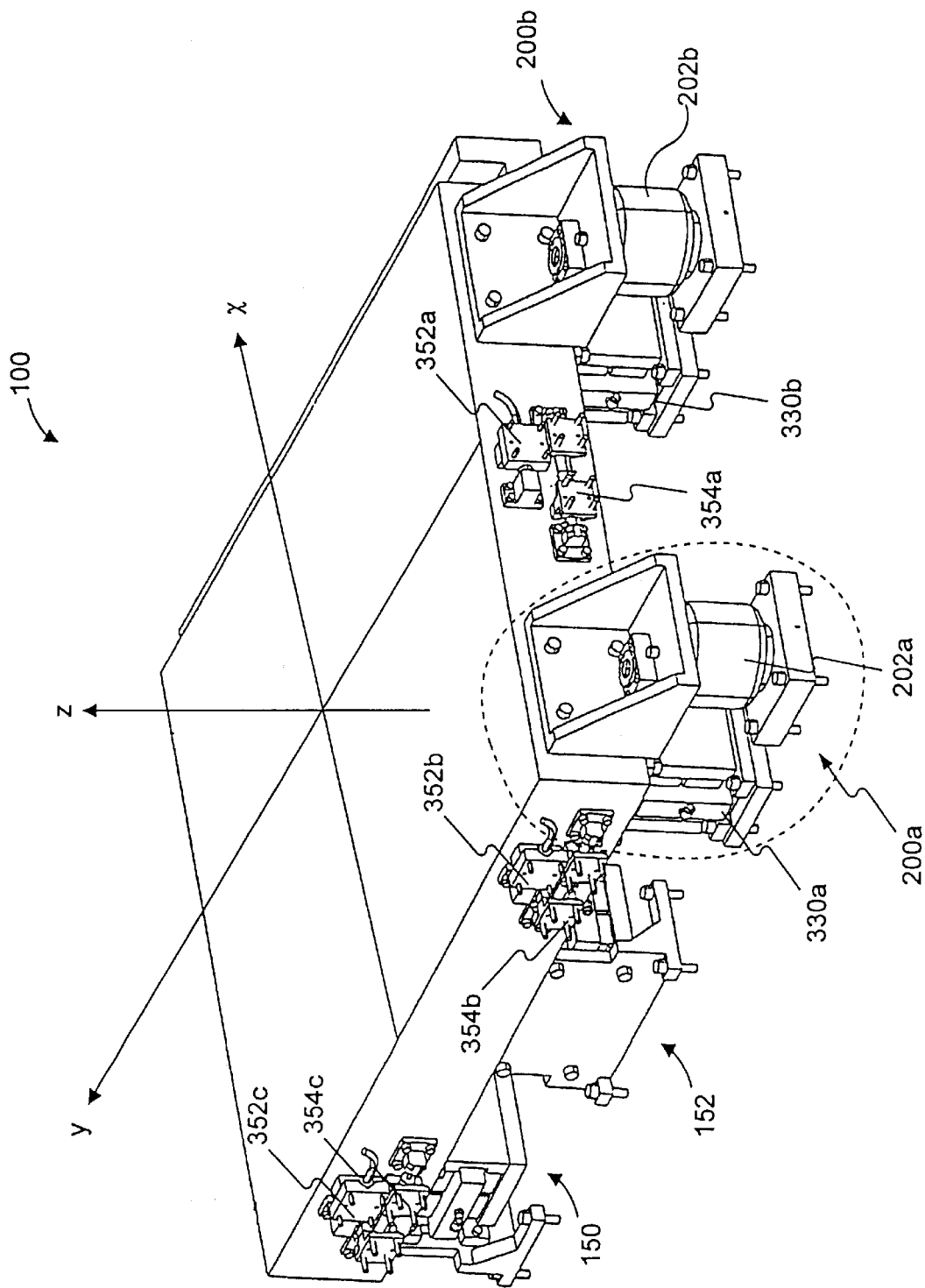
FIG. 2 is a perspective view of a stage device incorporating the AVIS.

In one embodiment, as illustrated in FIG. 2, a stage device 100 is supported and isolated from vibration by implementing a plurality of (commonly at least three) AVIS 200, such as is shown in FIG. 1. Stage device 100 includes AVIS 200a and 200b, each including pneumatic control system 202a and 202b, respectively, and electronic control system 330a and 330b, respectively, to generate force supporting stage device 100 and counteracting vibration parallel to z-axis. A third AVIS (not shown) is located on an edge of stage device 100 opposite from AVIS 200a, 200b, and generally coinciding with positive y-axis. Stage device 100 also includes at least one electronic control system 150 to generate force counteracting vibration parallel to y-axis. Finally, stage device 100 preferably includes at least one electronic control system 152 to generate force counteracting vibration parallel to x-axis. Stage device 100 is also illustrated having a series of position sensors 352a, 352b, 352c, and velocity sensors 354a, 354b, 354c.

According to the conventional AVIS, the pneumatic control system can generate a large pneumatic force to support the mass without generating heat, but it does not have a high frequency response. And, although the electronic control system has a high frequency response, it generates heat and consumes a lot of power to generate a large electronic force to support the mass. Another disadvantage of the conventional AVIS is that the pneumatic and electronic control systems work independent of each other. In addition, the response time for pneumatic control system to the generate pneumatic force is high due to the natural frequency of a pneumatic system. Consequently, the electronic control system must generate the electronic force to compensate for the late response of pneumatic control system. When the electronic control system generates the electronic force, heat is also inevitably generated. As discussed in the Description of the Related Art, the heat generated subsequently alters the thermal properties of surrounding air and lithography parts which subsequently reduces the focus precision of the lithography system.

Subsequently, the following describes an AVIS control system and method having pneumatic and electronic control systems that can maximize the individual output thereof, to provide high frequency vibration control, eliminate the heat dissipation, and prevent the electronic and pneumatic actuators from working against each other.

Figure 3:
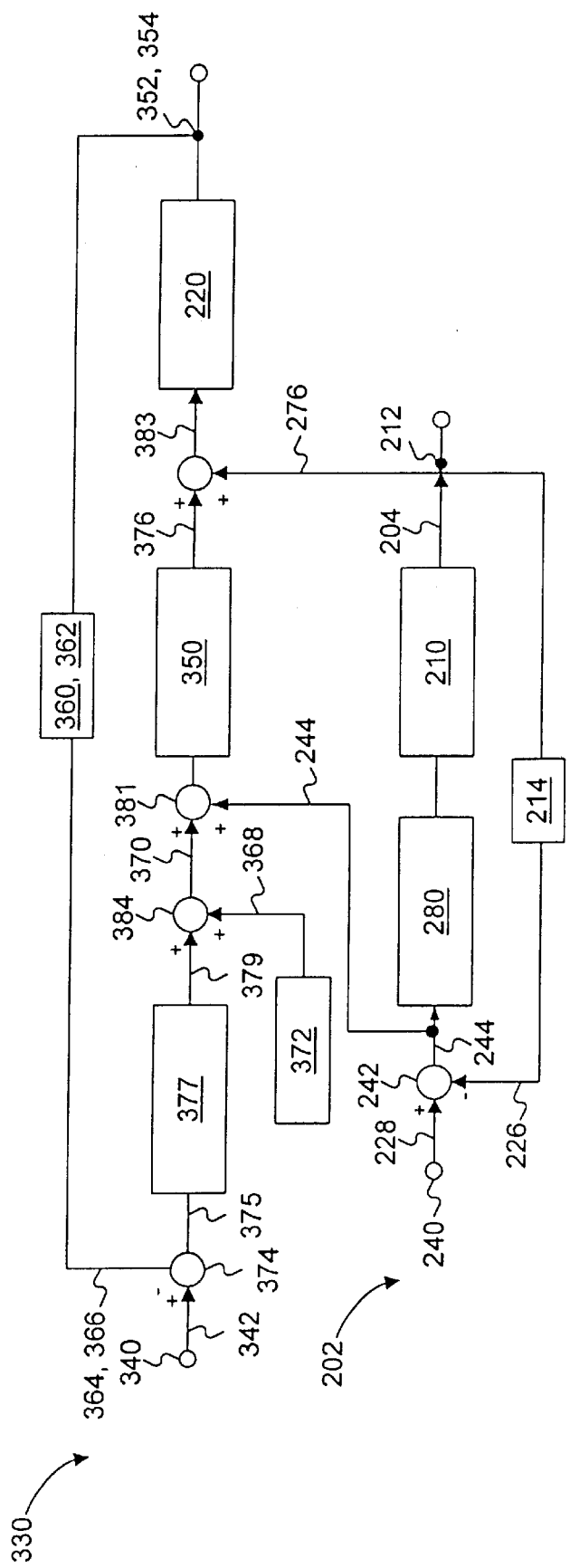
FIG. 3 is a schematic view of a first embodiment of the AVIS consistent with the principles of the present invention in detail.

Consistent with the principles of the present invention as illustrated in FIGS. 1, 3, and 8. AVIS also includes a pneumatic control system 202 and an electronic control system 330. FIG. 8 illustrates when the AVIS is used to isolate vibration in exposure apparatus Electronic control system 330 has at least one motion sensor, at least one feedback system, an electronic actuator 350, and a feedforward system.

Consistent with the principles of the invention, a method and apparatus for maximizing operation of an active vibration isolation system will be described. In the pneumatic control system 202, pressure sensor 212 measures the pressure level 204 of compliance chamber 210. Pneumatic feedback system 214 determines a measured pressure signal 226 based on the measured pressure level 204, and delivers the measured pressure signal 226 to summing junction 242.

Summing junction 242 combines measured pressure signal 226, assigned as having a negative value, and reference pressure signal 228, having a positive value, to generate a pressure error signal 244. Pressure error signal 244 is then used by pneumatic control system 202 and electronic control system 330.

As shown in FIG. 3, motion sensors of electronic control system 330 include a position sensor 352 and a velocity sensor 354, shown as a single element for convenience. Position sensor 352 measures a position of mass 220 relative to a reference point, such as ground, and generates a position signal 364. Position signal 364 is delivered to summing junction 374. Velocity sensor 354 measures an absolute velocity representing vibration of mass 220 caused by the external disturbances, and generates a velocity signal 366. Velocity signal 366 is delivered to summing junction 374.

In alternative embodiments, only one of position sensor 352 and velocity sensor 354 is used. When both position sensor 352 and velocity sensor 354 are used, however, summing junction 374 compares the sum of position signal 364 and velocity signal 366 with a reference motion signal 342 that includes a reference position signal and a reference velocity signal. The sum of position signal 364 and velocity signal 366 is a negative value input to summing junction 374, whereas reference motion signal 342 is a positive value input. Reference motion signal 342 including a reference position signal (not shown) and a reference velocity signal (also not shown). Reference motion signal 342 is determined by first motion controller 340, such as a computer simulating a mathematical model of the AVIS 200. Summing junction 374 generates a motion error signal 375 in response to the signals.

Based on motion error signal 375, a second motion controller 377 determines a motion force error signal 379 representing the force needed to cancel positional drift of mass 220 as detected by position sensor 352 and vibration of mass 220 as detected by velocity sensor 354. Second motion controller 377 may be any device capable of computing motion force error signal 379. In one embodiment, second motion controller 377 is a programmable computer implementing a mathematical calculation in a loop control filter.

Electronic control system 330 also includes an electronic feedforward system 372 to generate a disturbance canceling force signal 368. In one embodiment, electronic feedforward system 372 is a computer that simulates a mathematical model based on the weight and position of the center of gravity of mass 220 to determine disturbance canceling force signal 368, which compensates for other disturbances not detected by position sensor 352 nor velocity sensor 354.

Summing junction 384 combines motion force error signal 379 and disturbance canceling force signal 368 to generate an electronic error signal 370.

Consistent with the principles of the present invention, pressure error signal 244 from the pneumatic control system 202 is fed forward to electronic control system 330.

The response time for pneumatic control system 202 is relatively low compared with electronic control system 330. By feeding pressure error signal 244 to electronic control system 330, AVIS 200 utilizes the fast response of electronic actuator 350 to maximize system bandwidth, encompassing a broad range of operating frequency of AVIS 200.

Summing junction 381 sums pressure error signal 244 and electronic error signal 370, and delivers the sum to an electronic actuator 350. Electronic actuator 350, for example a motor, converts this sum into electronic force 376. Electronic force 376 represents the physical force that electronic control system 330 generates to support and isolate mass 220. Electronic force 376 and pneumatic force 276 collectively exert a total force 383 on mass 220 to support and isolate mass 220 from vibration.

Figure 4:
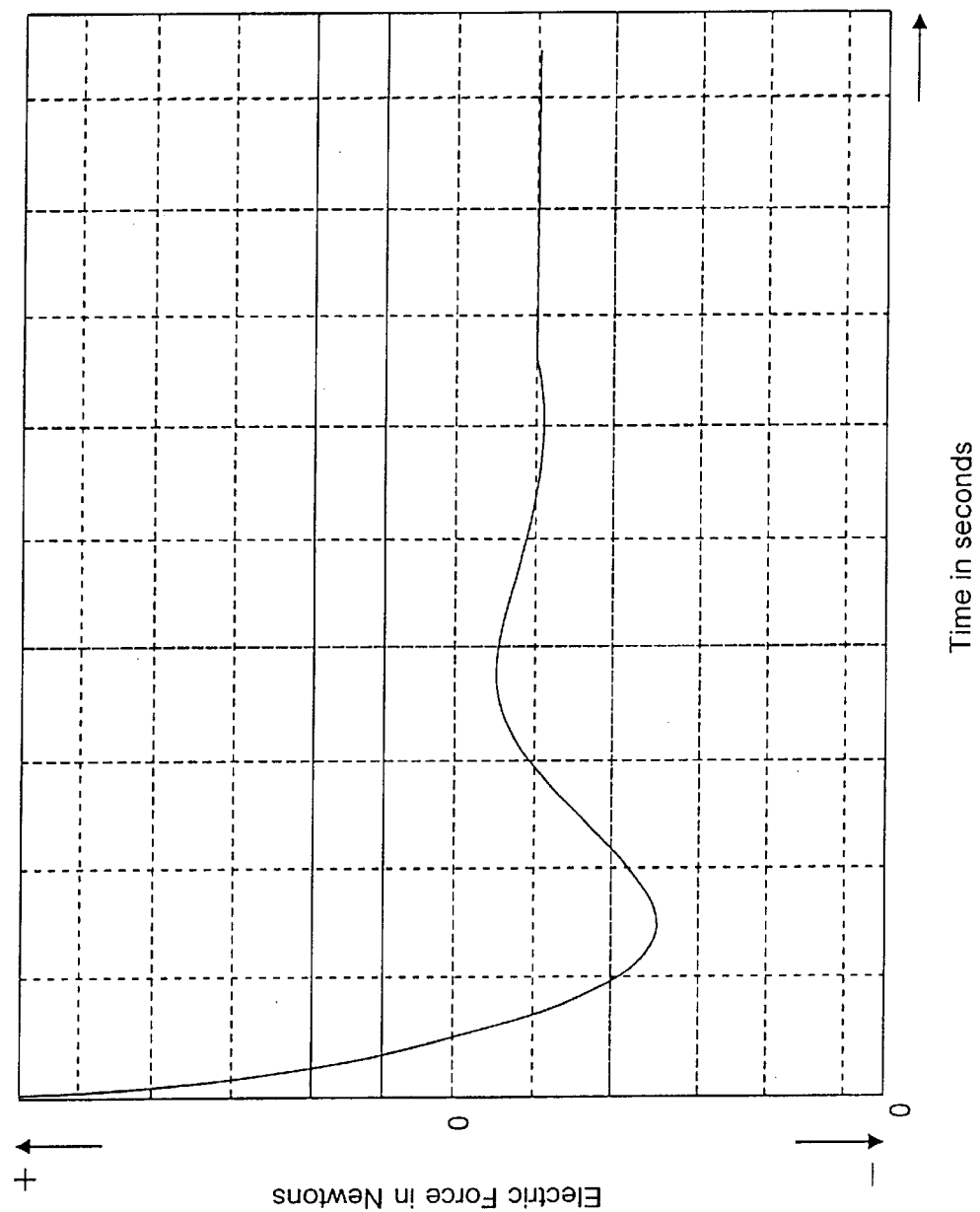
FIG. 4 is a chart of an electronic force generated by an electronic actuator during a simulation of the AVIS first embodiment.
Figure 5:
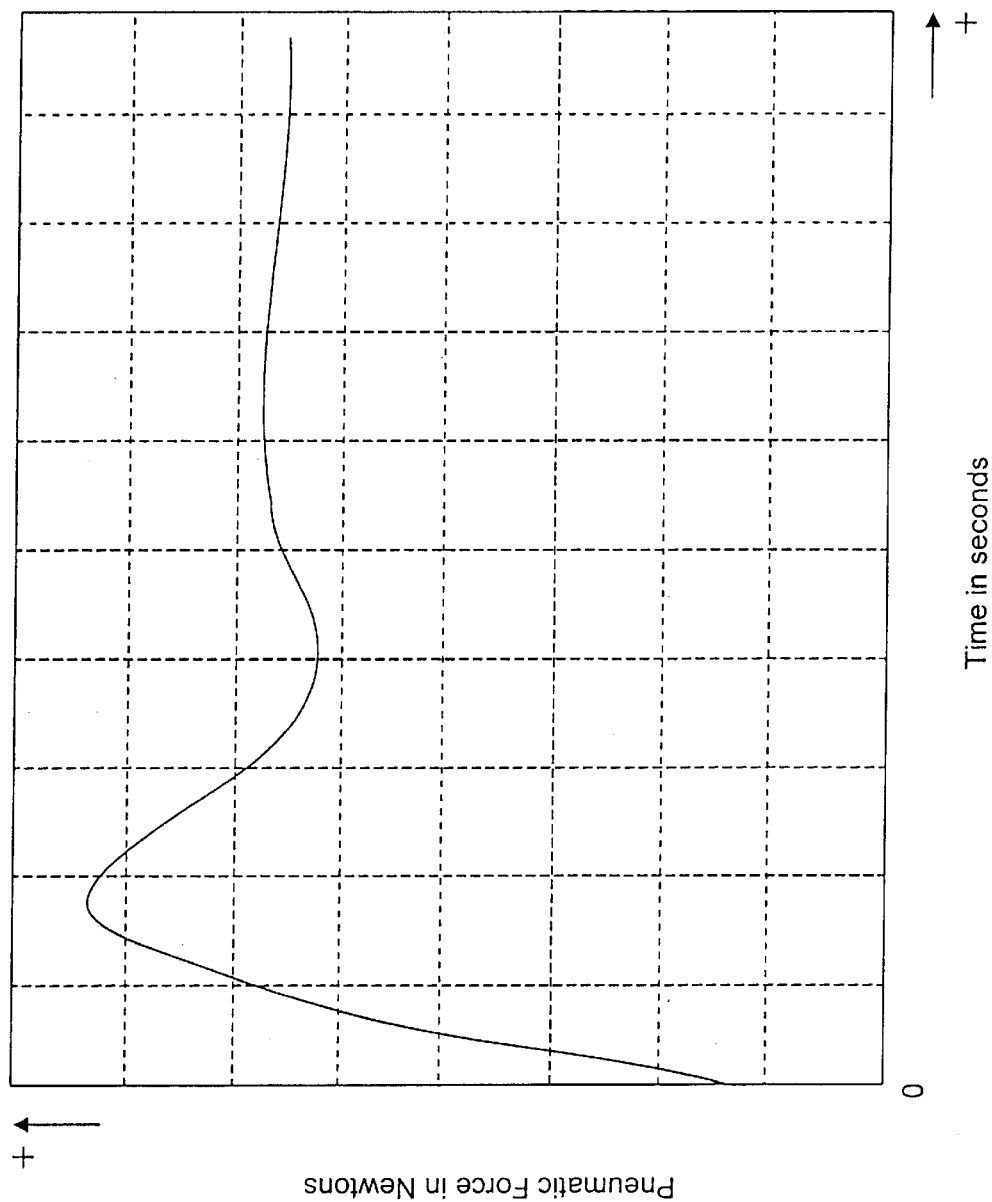
FIG. 5 is a chart of a pneumatic force generated by pneumatic actuator during a simulation of the AVIS first embodiment.

FIGS. 4 and 5 show the results of a simulation of the AVIS 200 according to the first embodiment. FIG. 4 represents electronic force 376 in Newtons along the y-axis over a period of time in seconds along the x-axis. FIG. 5 represents pneumatic force 276 in Newtons along the y-axis over a period of time in seconds along the x-axis. The sum of pneumatic force 276 and electronic force 376 represents total force 383, which should be a constant value to isolate mass 220 from the external disturbances.

The first embodiment reduces the lagging response time of pneumatic control system 202 by feedforwarding pressure error signal 244 to the electronic control system 330. Therefore, the overall errors as measured by pressure sensor 212, position sensor 352, and velocity sensor 354 are simultaneously corrected. The AVIS 200 according to the first embodiment may still, however, generate excessive heat for a heat sensitive system, such as a lithography system, because the electronic control system 330 is used to compensate for the error due to the slow response of pneumatic control system 202. Upon receiving the pressure error signal 244, the electronic control system 330 generates electronic force 376 to offset the lagging of pneumatic control system 202, i.e., a DC force of −20 Newtons. This DC force generates the problematic heat.

Figure 6:
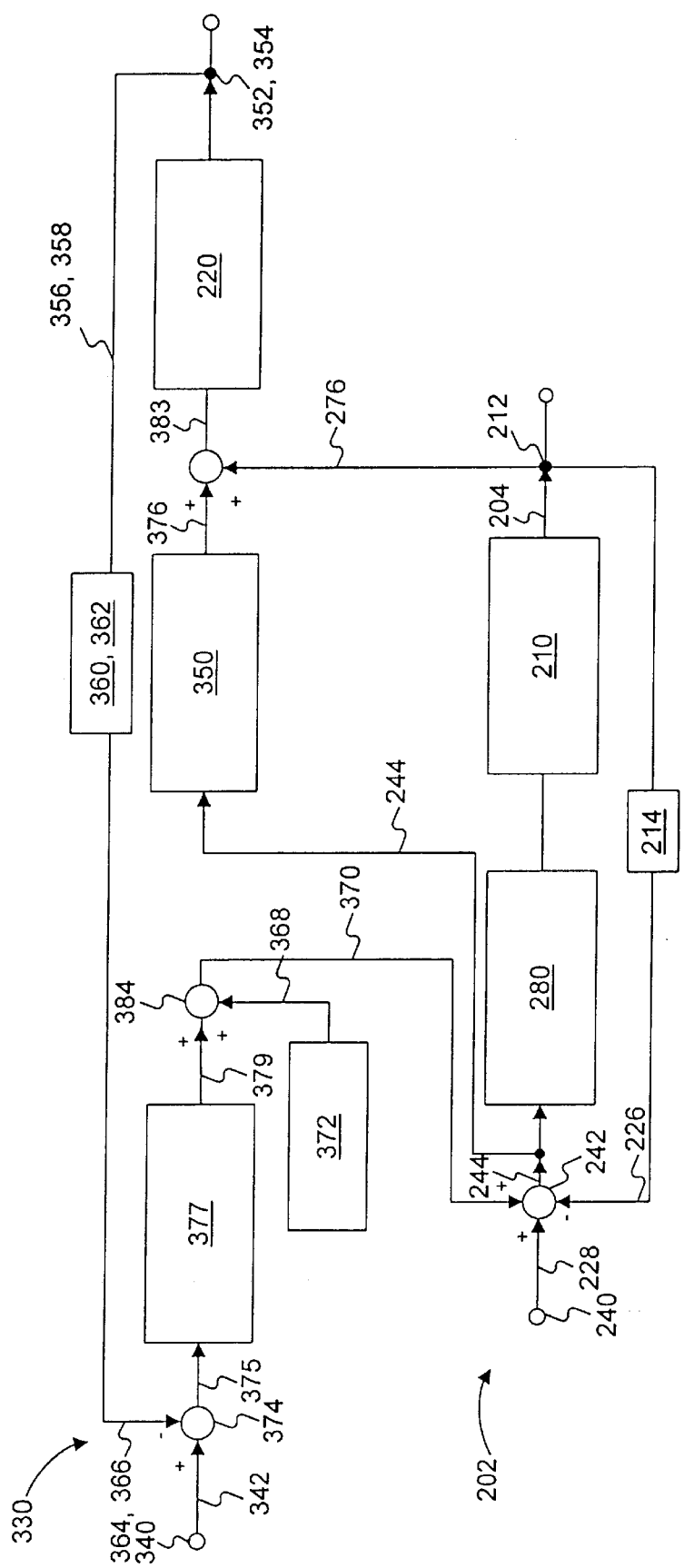
FIG. 6 is a schematic view of a second embodiment of the AVIS consistent with the principles of the present invention.

A second embodiment of the present invention, illustrated in FIG. 6, is directed to a method and apparatus for maximizing operation of the AVIS which reduces the response time of the pneumatic control system, and eliminates or substantially reduces the heat problem. Consistent with the principles of the invention, a method and apparatus are provided to maximize operation of an active vibration isolation system. Similar to the first embodiment, in pneumatic control system 202, pressure sensor 212 measures pressure level 204 of compliance chamber 210. Pressure sensor 212 measures pressure level 204 to generate a measured pressure signal 226, which is then delivered to summing junction 242.

Summing junction 242 compares measured pressure signal 226 of compliance chamber 210 with a reference pressure signal 228. Pneumatic feedforward system 240, such as a computer, may be used to calculate reference pressure signal 228, which is delivered to summing junction 242.

According to the second embodiment, electronic error signal 370 from electronic control system 330 is delivered to summing junction 242 of pneumatic control system 202. Summing junction 242 sums electronic error signal 370 as a positive value, measured pressure signal 226 as a negative value, and reference pressure signal 228 as a positive value, to generate a pressure error signal 244; The pressure error signal 244 is then, similar to the first embodiment, used for both pneumatic control system 202 and electronic control system 330.

In pneumatic control system 202, in response to pressure error signal 244, the pneumatic actuator 280 controls the pressure level in compliance chamber 210 to maintain constant pressure level 204. Compliance chamber 210 generates a pneumatic force 276 in proportion to the pressure level 204 to support mass 220.

Electronic control system 330, similar to the first embodiment, includes motion sensors such as a position sensor 352 and a velocity sensor 354, shown as a single element for convenience. Position sensor 352 measures a position of mass 220 relative to a reference point, such as ground, and generates a position signal 364. Position signal 364 is delivered to summing junction 374. Velocity sensor 354 measures an absolute velocity representing vibration of mass 220 caused by external disturbances, and generates a velocity signal 366. Velocity signal 366 is delivered to summing junction 374.

In alternative embodiments, only one of position sensor 352 and velocity sensor 354 is used. When both position sensor 352 and velocity sensor 354 are used, however, summing junction 374 compares the sum of position signal 364 and velocity signal 366 with a reference motion signal 342. The sum of position signal 364 and velocity signal 366 is a negative value input to summing junction 374, whereas reference motion signal 342 is a positive value input. Reference motion signal 342 is determined by first motion controller 340, such as a computer simulating a mathematical model of AVIS 200. Summing junction 374 generates a motion error signal 375 in response to the signals.

Based on motion error signal 375, a second motion controller 377 determines a motion force error signal 379 representing the force needed to cancel positional drift of mass 220 as detected by position sensor 352 and vibration of mass 220 as detected by velocity sensor 354. Second motion controller 377 may be any device capable of computing motion force error signal 379. In one embodiment, second motion controller 377 is a programmable computer implementing a mathematical calculation in a control loop filter.

Also similar to the first embodiment, electronic control system 330 includes an electronic feedforward system 372 to generate a disturbance canceling force signal 368. In one embodiment, electronic feedforward system 372 is a computer that simulates a mathematical model based on the weight and position of the center of gravity of mass 220 to determine disturbance canceling force signal 368, which compensates for other disturbances not detected by position sensor 352 nor velocity sensor 354.

Summing junction 384 combines motion force error signal 379 and disturbance canceling force signal 368 to generate an electronic error signal 370.

Unlike the first embodiment, electronic error signal 370 is then fed forward to summing junction 242 of the pneumatic control system 202. Therefore, according to the second embodiment, summing junction 242 combines measured pressure signal 226 as a negative value, reference pressure signal 228 as a position value, and electronic error signal 370 as a positive value, to generate pressure error signal 244.

Similar to the first embodiment, pressure error signal 244 is used for both pneumatic 202 and electronic 330 control system. According to the second embodiment, however, pneumatic control system 202 is utilized to correct pressure, positional, and velocity errors, as well as other errors not detected by sensors 212, 352, 354, because pressure error signal 244 includes electronic error signal 370. Therefore, electric force 376 generated by electric actuator 350 is reduced, thereby reducing the heat associated therewith.

According to the second embodiment, in the electronic control system 330, pressure error signal 244 is also fed forward to electronic actuator 350. Therefore, electronic control system 330 utilizes the fast response of electronic actuator 350 to compensate for the balance of pressure, positional, and velocity errors that pneumatic control system 202 is too slow to correct. Electronic actuator 350 converts pressure error signal 244 into an electronic force 376. The electronic force 376 and pneumatic force 276 collectively exert total force 383 to support mass 220 and isolate it from vibration.

Figure 7:
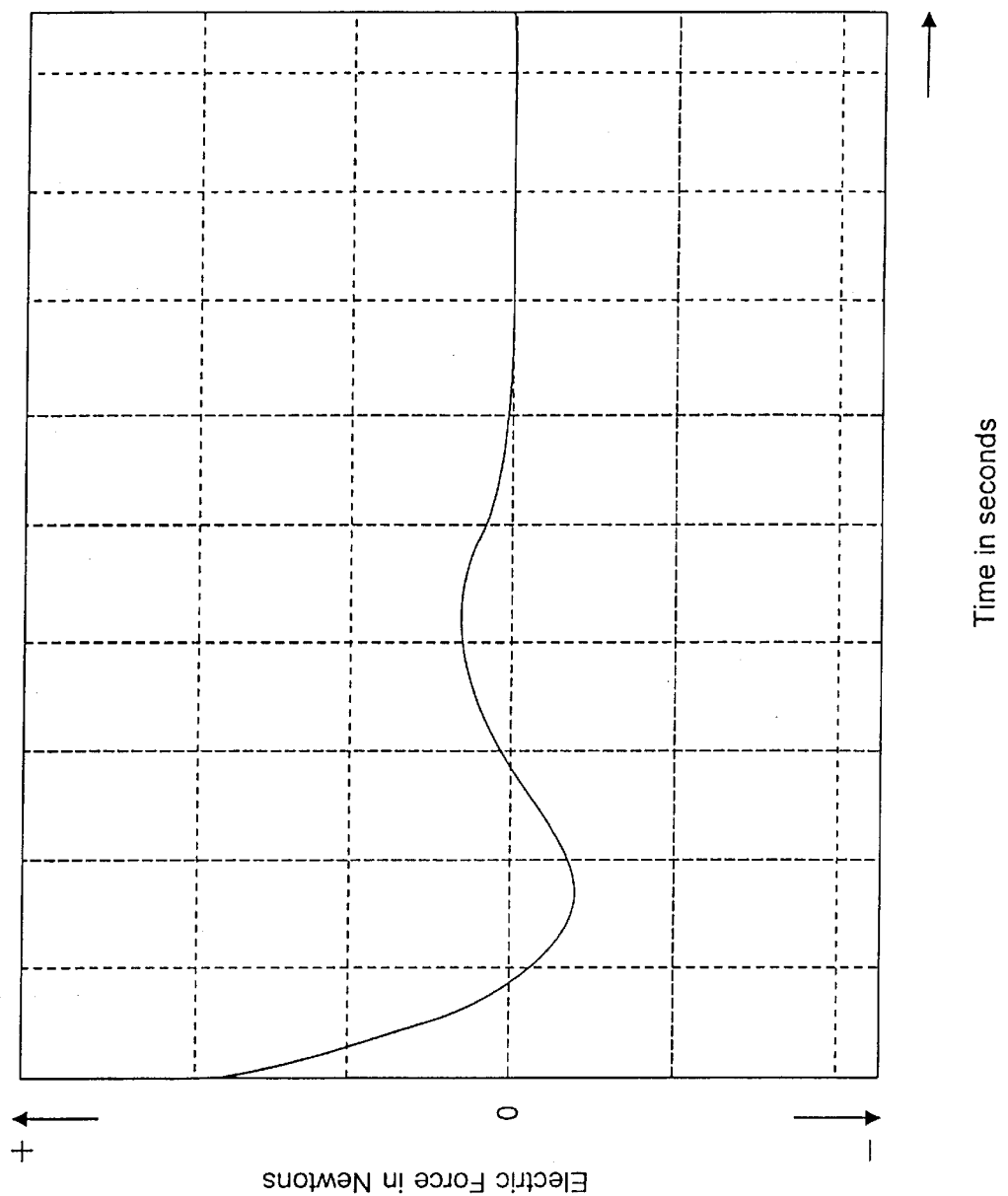
FIG. 7 is a chart of an electronic force generated during a simulation of the AVIS second embodiment.

FIG. 7 shows of a simulation of the AVIS 200 according to the second embodiment under conditions similar to the first embodiment. FIG. 7 represents electronic force .376 in Newtons along the y-axis over a period of time in seconds along the x-axis. Electronic force 376 levels off at 0 Newtons after passing a short period of time. Therefore, electronic control system 330 generates little, if any, DC force to compensate a steady state error of pneumatic reference signal 228, thus, overcoming the heat problem.

AVIS 200 is particularly useful to isolate stage device(s) of an exposure apparatus in a lithography process. In operation, exposure apparatus 21 shown in FIG. 8 transfers a pattern of an integrated circuit from reticle 80 onto semiconductor wafer 68. Exposure apparatus 21 mounts to a base 82, i.e., a floor or the ground or some other supporting structure, or is supported by an AVIS.

Apparatus frame 72 is rigid and supports the components of the exposure apparatus 21. The design of the apparatus frame 72 can be varied to suit the design requirements for the rest of exposure apparatus 21. Apparatus frame 72 illustrated in FIG. 8, supports reticle stage 76, lens assembly 78, and illumination system 74 above base 64. Wafer stage 66 is supported by AVIS 200 individually from apparatus frame 72. Alternately, for example, an integrated structure (not shown) can be used to support wafer stage 66 and reticle stage 76, illumination system 74, and lens assembly 78 above base 82.

Illumination system 74 includes an illumination source 84 and an illumination optical assembly 86. Illumination source 84 emits the beam (irradiation) of light energy. Illumination optical assembly 86 guides the beam of light energy from illumination source 84 to lens assembly 78. The beam illuminates selectively different portions of reticle 80 and exposes wafer 68. In FIG. 8, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 80 to wafer 68. Depending upon the design of apparatus 21, lens assembly 78 can magnify or reduce the image illuminated on reticle 80.

Wafer stage 66 and/or reticle stage 76 are isolated from vibration by AVIS 200 (not shown) consistent with the principles of the present invention. Reticle stage 76 holds and precisely positions reticle 80 relative to lens assembly 78 and wafer 68. Somewhat similarly, wafer stage 66 holds and positions wafer 68 with respect to the projected image of the illuminated portions of reticle 80. In the embodiment illustrated in FIG. 8, wafer stage 66 and reticle stage 76 are positioned by a plurality of motors 10. Depending upon the design, apparatus 21 can also include additional servo drive units, linear motors and planar motors to move wafer stage 66 and reticle stage 76.

There are a number of different types of photolithographic devices. For example, exposure apparatus 21 can be used as a scanning type photolithbgraphy system which exposes the pattern from reticle 80 onto wafer 68 with reticle 80 and wafer 68 moving synchronously. In a scanning type lithographic device, reticle 80 is moved perpendicular to an optical axis of lens assembly 78 by reticle stage 76 and wafer 68 is moved perpendicular to an optical axis of lens assembly 78 by wafer stage 66. Scanning of reticle 80 and wafer 68 occurs while reticle 80 and wafer 68 are moving synchronously.

Alternately, exposure apparatus 21 can be a step-and-repeat type photolithography system that exposes reticle 80 while reticle 80 and wafer 68 are stationary. In the step and repeat process, wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

However, the use of exposure apparatus 21 provided herein is not limited to a photolithography system for semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines and, inspection machines.

The illumination source 84 can be g-line (436 nm), i-line (365 nm), KrF excimer laser (248 nm), ArF excimer laser (193 nm) and $F_2$ laser (157 nm). Alternately, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of lens assembly 78 included in the photolithography system, lens assembly 78 need not be limited to a reduction system. It could also be a 1×or magnification system.

With respect to lens assembly 78, when far ultra-violet rays such as the excimer laser is used, glass materials such as quartz and fluorite that transmit far ultra-violet rays is preferable to be used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. As far as is permitted, the disclosures in the abovementioned U.S. patents, as well as the Japan patent applications published in the Official Gazette for Laid-Open Patent Applications are incorporated herein by reference.

Further, in photolithography systems, when linear motors (see U.S. Pat. Nos. 6,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 9:
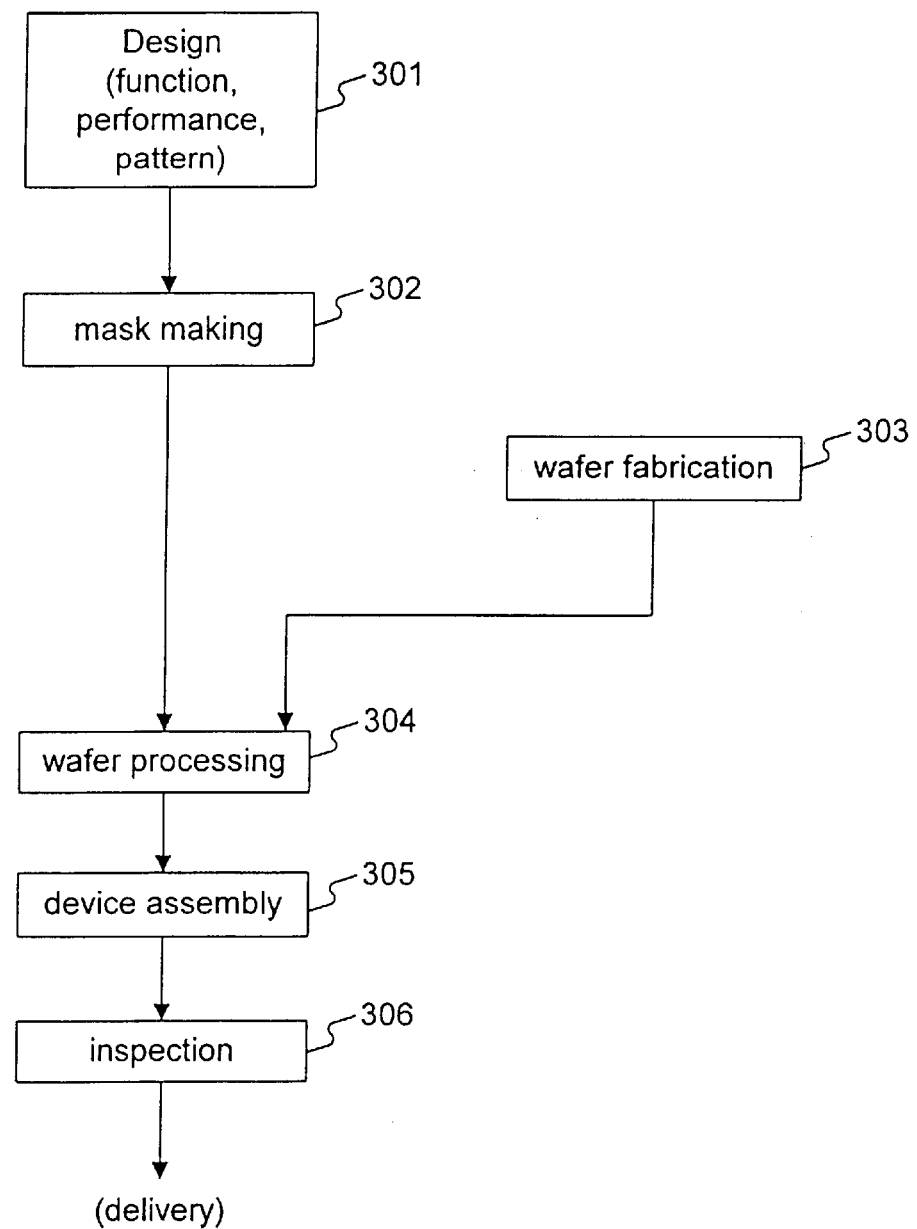
FIG. 9 is a flow chart outlining a process for manufacturing an apparatus in accordance with the present invention.

Further, semiconductor devices can be fabricated using the above described systems, by the process shown generally in FIG. 9. In step 301 the device's function and, performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 306 the semiconductor device is assembled (including the dicing process, bonding process and packaging process), then finally the device is inspected in step 306.

Figure 10:
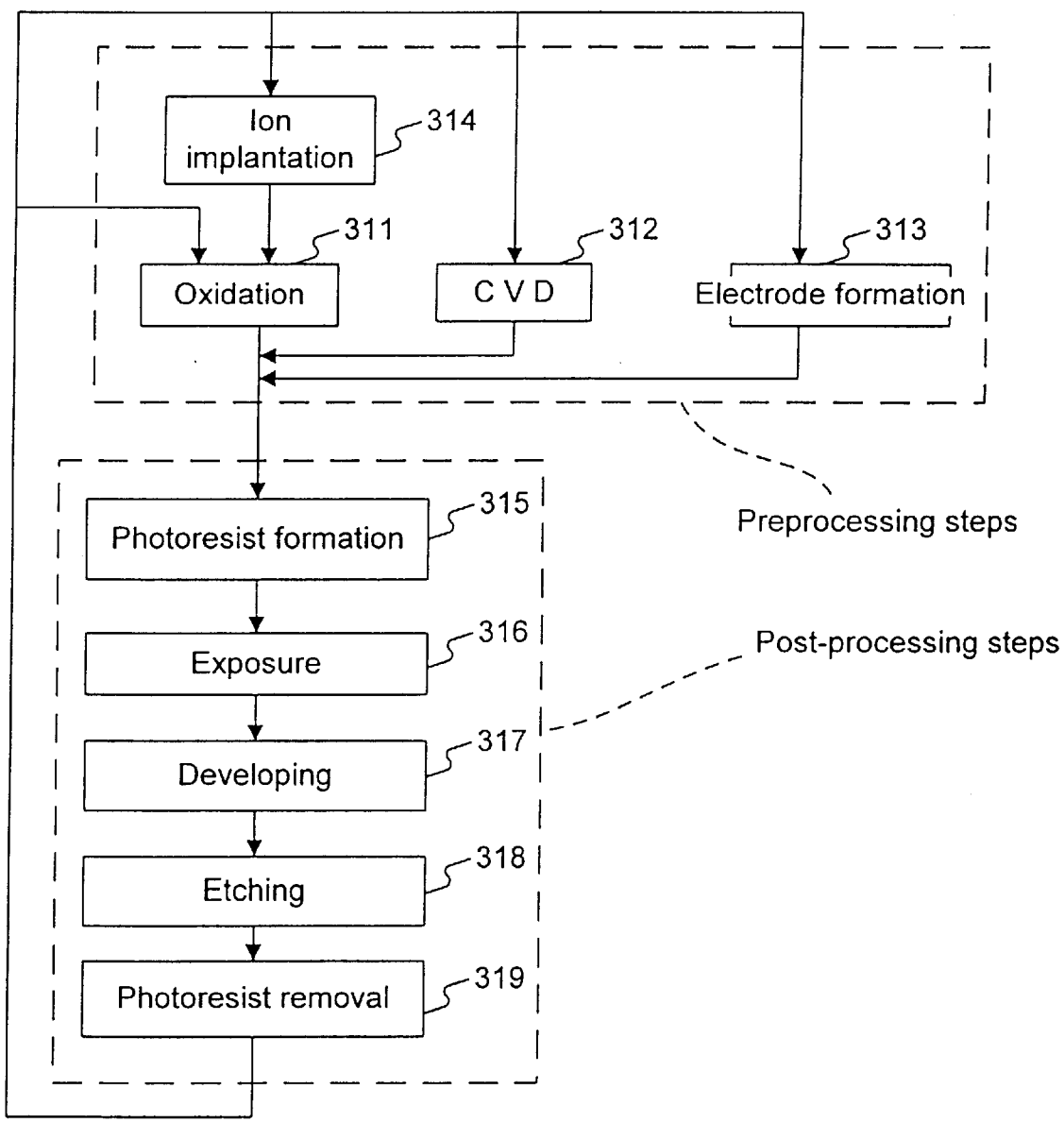
FIG. 10 is a flow chart outlining an apparatus processing in further detail.

FIG. 10 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in he methods described, in stage device, the material chosen for the present invention, and in construction of the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A method for operating a vibration isolation system having a pneumatic control system and an electronic control system, comprising the steps of:

generating a pneumatic force in the pneumatic control system to support a mass, the pneumatic force produced by a pressure level in a compliance chamber, the pressure level being controlled in response to a pressure error signal;

delivering the pressure error signal to the electronic control system; and monitoring a motion error signal of the mass in the electronic control system, the motion error signal being used to generate an electronic force to isolate the mass from vibration, the electronic force being determined based on a combination of the pressure error signal and the motion error signal.

2. The method of claim 1, wherein the step of generating a pneumatic force in the pneumatic control system, further comprises:

measuring the pressure level of the compliance chamber to generate a pressure signal;

generating the pressure error signal based on the pressure signal and a reference pressure signal; and controlling the pressure level in the compliance chamber in response to the pressure error signal.

3. The method of claim 2, wherein the step of measuring the pressure level, further comprises:

determining the pressure signal based on a measured pressure level.

4. The method claim 2, wherein the step of generating the pressure error signal, further comprises:

determining the reference pressure signal.

5. The method of claim 2, wherein the step of generating the pressure error signal, further comprises:

comparing the pressure signal with the reference pressure signal.

6. The method of claim 2, wherein the step of controlling the pressure level, further comprises:

maintaining a constant pressure level in the compliance chamber.

7. The method of claim 1, wherein the step of monitoring a motion error signal in the electronic control system, further comprises:

measuring a motion of the mass to generate a motion signal; and generating the motion error signal based on the motion signal and a reference motion signal.

8. The method of claim 7, wherein the step of measuring a motion of the mass, further comprises:

measuring a position of the mass.

9. The method of claim 8, wherein the step of generating the motion error signal, further comprises:

determining a position signal based on the measured position; and comparing the position signal with a reference position signal to generate the motion error signal.

10. The method of claim 7, further comprising:

determining the reference motion signal.

11. The method of claim 10, further comprising:

determining a motion force error signal based on the motion error signal.

12. The method of claim 11, further comprising:

generating a disturbance canceling force signal to counteract the motion force error signal, and resulting in an electronic error signal; and combining the electronic error signal and the pressure error signal to generate the electronic force.

13. The method of claim 12, wherein the step of generating a disturbance canceling force signal further comprises:
determining the disturbance canceling force signal.
14. The method of claim 7, wherein the step of monitoring a motion error signal, further comprises:
determining the electronic force based on the combination of the pressure error signal and the motion error signal.
15. The method of claim 7, wherein the step of measuring a motion of the mass, further comprises:
measuring a velocity of the mass.
16. The method of claim 15, wherein the step of generating the motion error signal, further comprises:
determining a velocity signal based on a measured velocity; and
comparing the velocity signal with a reference velocity signal to generate the motion error signal.
17. A vibration isolation system using the method as claimed in claim 1.
18. A lithography system comprising a vibration isolation system as claimed in claim 17.
19. An object on which an image has been formed by the lithography system of claim 18.
20. A vibration isolation system, comprising:
a pneumatic control system having a compliance chamber to generate a pneumatic force that supports a mass based on a pressure error signal;
an electronic control system having a motion sensor to generate a motion error signal of the mass;
a force generator connected with the pneumatic control system and the electronic control system, the force generator generating an electronic force based on results of a combination of the pressure error signal and the motion error signal to isolate the mass from vibration.
21. A method for operating a vibration isolation system having a pneumatic control system and an electronic control system, comprising the
generating a pressure error signal in the pneumatic control system based on a pressure signal of a compliance chamber and a reference pressure signal;
controlling the pressure level in the compliance chamber in response to the pressure error signal, the compliance chamber generating a pneumatic force in proportion to a controlled pressure level to pneumatically support a mass;
delivering the pressure error signal to the electronic control system;
comparing a motion signal of the mass in the electronic control system with a reference motion signal to generate a motion error signal;
combining the motion error signal and the pressure error signal; and
determining an electronic force to isolate the mass from vibration based on a combination of the motion and pressure error signals.
22. The method of claim 21, wherein the generating step in the pneumatic control system, further comprises:
measuring the pressure level in the compliance chamber; and
determining the pressure signal based on a measured pressure level.

23. A vibration isolation system using the method as claimed in claim 22.
24. The method of claim 21, wherein the generating step in the pneumatic control system, further comprises:
determining the reference pressure signal.
25. The method of claim 21, wherein the controlling step in the pneumatic control system, further comprises:
maintaining a constant pressure level in the compliance chamber.
26. The method of claim 21, wherein the comparing step in the electronic control system, further comprises:
measuring a position of the mass;
determining a position signal based on a measured position; and
comparing the position signal with a reference position signal to generate the motion error signal.
27. The method of claim 21, wherein the comparing step in the electronic control system, further comprises:
measuring a velocity of the mass;
determining a velocity signal based on a measured velocity of the mass; and
comparing the velocity signal with a reference velocity signal to generate the motion error signal.
28. The method of claim 21, wherein the comparing step in the electronic control system, further comprises:
determining a motion force error signal based on the motion error signal.
29. The method of claim 28, further comprising:
generating a disturbance canceling force signal to counteract known or estimated diturbances; and
combining the disturbance canceling force signal, the electronic error signal and the pressure error signal to generate the electric force.
30. A vibration isolation system having a pneumatic control system and an electronic control system, comprising:
a pressure sensor for generating a pressure error signal based on a pressure information of a compliance chamber and a reference pressure information;
a first controller connected to the pressure sensor, the first controller controlling a pressure level in the compliance chamber in response to the pressure error signal;
a pneumatic force generator connected to the first controller, the pneumatic force generator generating a pneumatic force determined based on a controlled pressure level to pneumatically support a mass;
a second controller connected to the first controller, the second controller comparing a motion information of the mass with a reference motion signal to generate a motion error signal, and generating an electronic force signal based on the motion error signal and the pressure error signal; and
an electronic force generator connected to the second controller, the electronic force generator generating an electronic force to isolate the mass from vibration based on the motion error signal and the pressure error signal.
31. A lithography system comprising the vibration isolation system of claim 22.
32. An object on which an image has been formed by the lithography system of claim 31.

* * * * *

UNITED STATES PATENT AND TRADEMARK OFFICE
CERTIFICATE OF CORRECTION

PATENT NO. : 6,758,313 B2
DATED : July 6, 2004
INVENTOR(S) : Michael Binnard

It is certified that error appears in the above-identified patent and that said Letters Patent is hereby corrected as shown below:

Column 14,
Line 27, "method claim" should read -- method of claim --.

Column 15,
Line 39, after "comprising the" insert -- steps of: --.

Column 16,
Line 32, "disturbances;" should read -- disturbances --.
Line 60, "claim 22." should read -- claim 30. --.

Signed and Sealed this

Twelfth Day of October, 2004

JON W. DUDAS
*Director of the United States Patent and Trademark Office*